United States Patent [19]

Cobaugh et al.

[11] 4,087,906

[45] May 9, 1978

[54] METHOD OF SELECTIVELY APPLYING SOLDER ONTO CONDUCTORS

[75] Inventors: Robert Franklin Cobaugh, Elizabethtown; Kenneth Ronald Parmer, Harrisburg, both of Pa.

[73] Assignee: AMP Incorporated, Harrisburg, Pa.

[21] Appl. No.: 600,162

[22] Filed: Jul. 29, 1975

Related U.S. Application Data

[60] Division of Ser. No. 487,505, Jul. 11, 1974, Pat. No. 3,915,546, which is a division of Ser. No. 306,498, Nov. 14, 1972, Pat. No. 3,849,870, which is a continuation-in-part of Ser. No. 153,315, Jun. 15, 1971, abandoned.

[51] Int. Cl.² ............................................. H01R 9/16
[52] U.S. Cl. ................................ 29/630 D; 427/120; 427/123; 427/282; 427/287; 29/527.2; 228/215
[58] Field of Search ............... 228/180 R, 37, 39, 215, 228/216, 260; 118/406, 410; 427/117, 277, 282, 367, 436, 120, 123, 287; 72/46; 29/630 D, 527.2

[56] References Cited

U.S. PATENT DOCUMENTS

| | | | |
|---|---|---|---|
| 2,392,886 | 1/1946 | Stecher et al. | 228/215 X |
| 2,588,172 | 3/1952 | Snavely et al. | 339/275 B X |
| 2,877,731 | 3/1959 | Allen | 228/33 |
| 3,230,297 | 1/1966 | Means | 228/215 X |
| 3,268,653 | 8/1966 | McNutt | 228/215 X |
| 3,429,734 | 2/1969 | Coad | 427/436 X |
| 3,667,109 | 6/1972 | Alcenius | 228/215 |
| 3,750,265 | 8/1973 | Cushman | 228/630 R X |
| 3,754,324 | 8/1973 | Krehbiel et al. | 29/630 R X |

Primary Examiner—Donald G. Kelly
Assistant Examiner—K. J. Ramsey
Attorney, Agent, or Firm—D. W. Phillion

[57] ABSTRACT

An electrical terminal structure is disclosed which is provided with a flow deposited quantity or band of solder adhered to a selected portion of the terminal and limited from spreading over the surface of the terminal by the presence of a solder-nonwettable material adjacent to but not necessarily touching the terminal. A method of mounting the banded electrical terminals in plated apertures provided in a substrate is also disclosed, wherein the solder bands are applied to the terminals according to the above mentioned application technique. A technique of flattening the solder bands, and the resulting terminal structures having flattened solder bands adhered thereto are also disclosed. Flattening of the solder bands facilitates insertion of the banded terminals into the plated apertures by changing the shape of the solder bands and by reducing their structural integrity through the creation of numerous hairline fractures.

4 Claims, 17 Drawing Figures

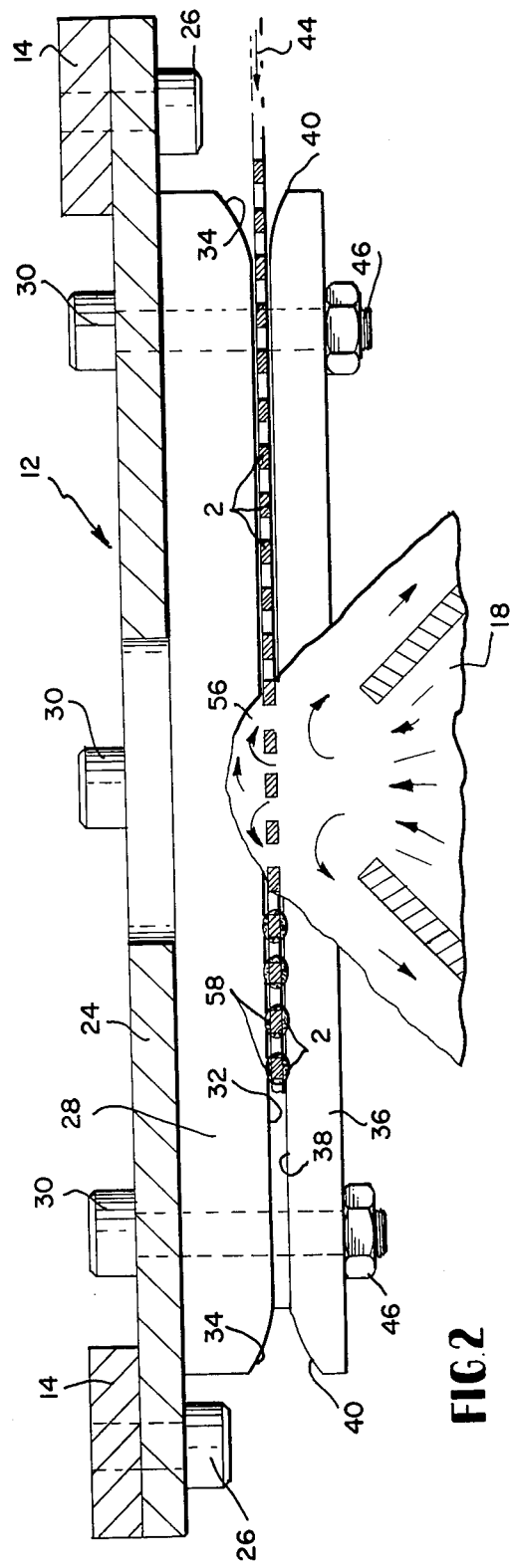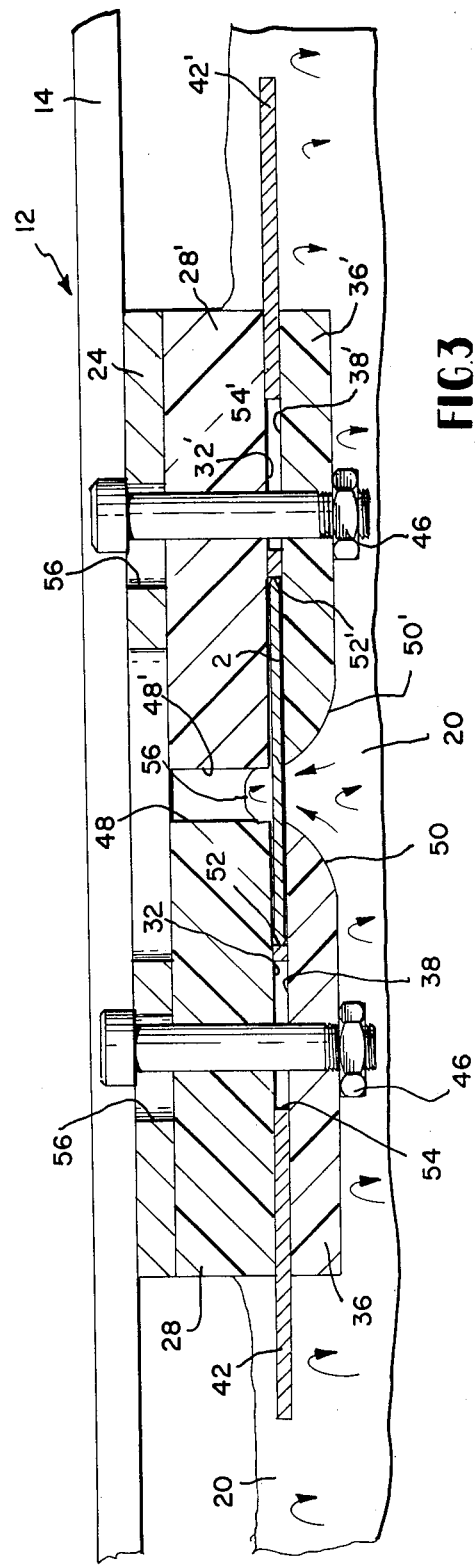

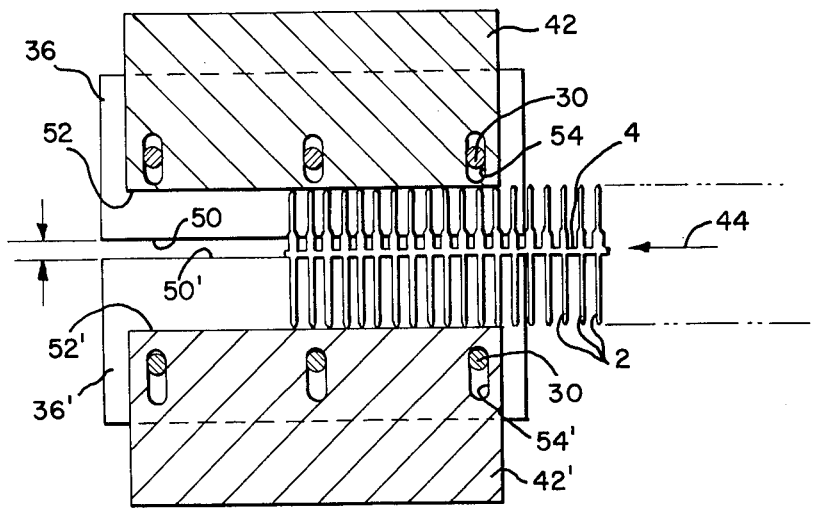
FIG.4
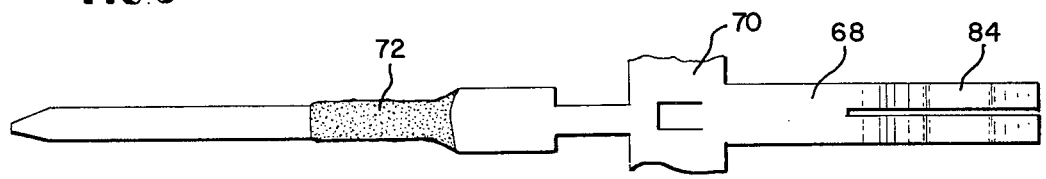
FIG.5
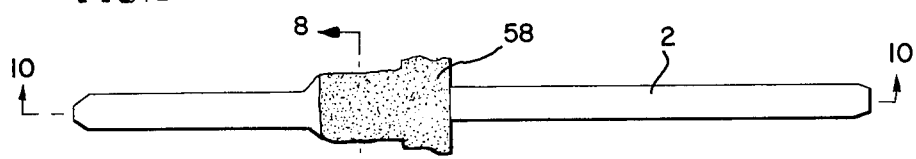
FIG.6
FIG.7
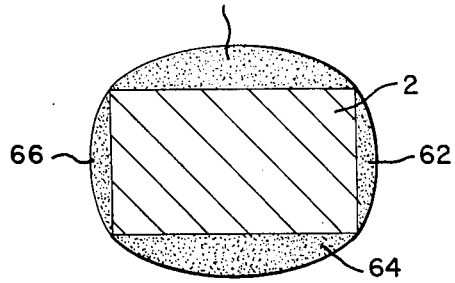
FIG.8
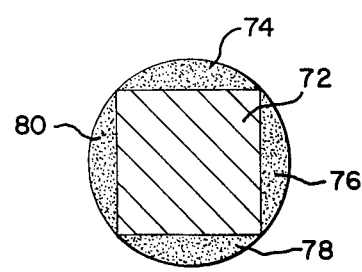
FIG.9

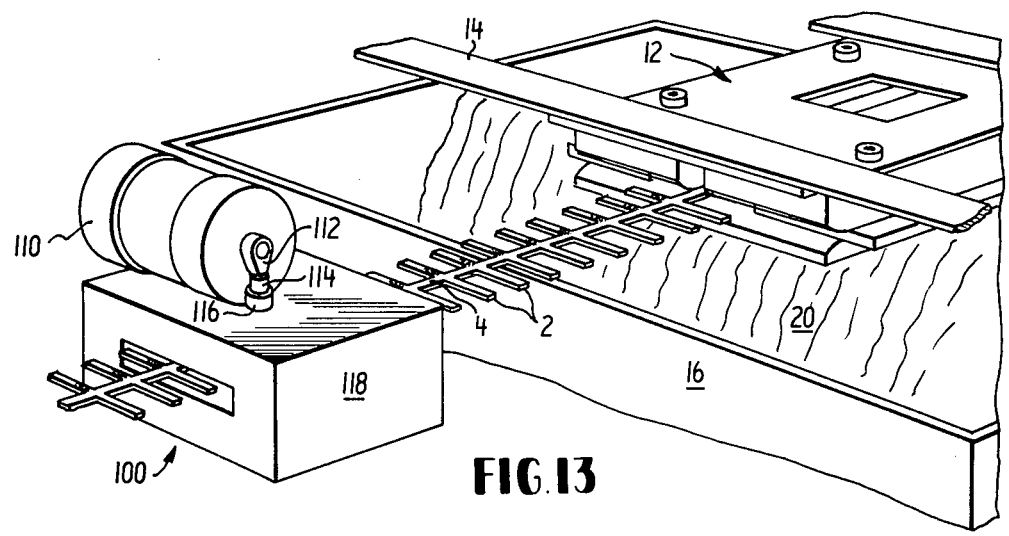
FIG.13
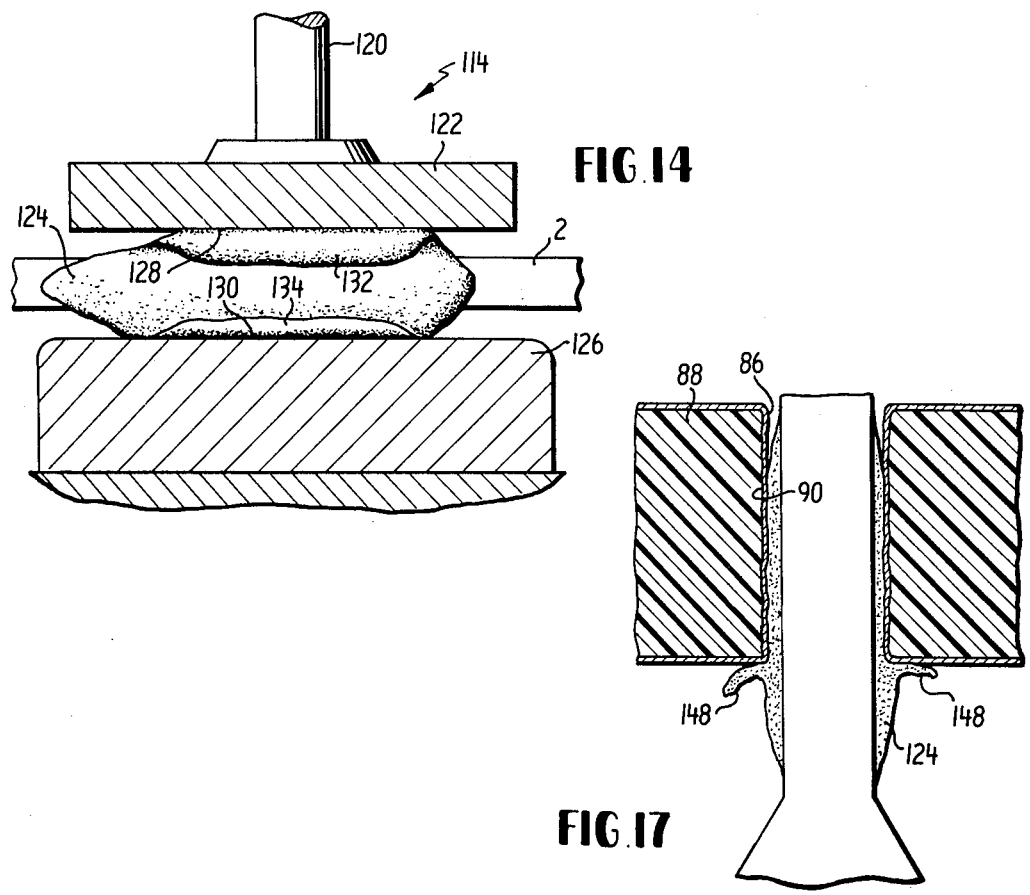
FIG.14
FIG.17

METHOD OF SELECTIVELY APPLYING SOLDER ONTO CONDUCTORS

CROSS REFERENCE TO RELATED APPLICATION

This is a division of application Ser. No. 487,505, filed July 11, 1974, now U.S. Pat. No. 3,915,546, which is in turn a division of application Ser. No. 306,498, filed Nov. 14, 1972 and now U.S. Pat. No. 3,849,870, which is in turn a continuation-in-part of application Ser. No. 153,315, filed June 15, 1971 and now abandoned.

BACKGROUND OF THE INVENTION

The present invention generally relates to a method and apparatus for adhering flowable solder to a solder-wettable substrate together with limiting the spreading of molten solder over the surface of the substrate, without the aid of a protective coating adhered to the substrate, and without the aid of a barrier between the substrate and the atmosphere. The present invention generally relates to a solder-wettable substrate in the form of an electrical terminal having a flow deposited quantity of solder adhered to a selected portion of the terminal with the solder being confined to the selected portion without the aid of a protective coating on the terminal or a barrier between the terminal and the atmosphere. The present invention relates to an electrical terminal having a plated aperture provided in a board substrate with a quantity of solder flowably adhered to a selected portion of the terminal, with the solder being reflowed and wicking into the clearance between the substrate aperture and the inserted terminal, such wicking action preventing escape of the reflowed solder and causing the formation of solder fillets surrounding the terminal at the substrate surface. The present invention further relates generally to a method of treating an electrical contact having a band of solder adhered thereto, and more particularly to a method of applying pressure to a contact having a band of solder adhered thereto. In addition, the present invention relates to a unique solder stripped contact structure having a flattened solder band adhered thereto.

Heretofore, flowably adhering solder to a selected portion of a solder-wettable substrate required the use of a high temperature resistant and solder resistant material adhered to the substrate and defining a structural barrier adjacent to the selected portion on which the solder was to be adhered. The resistant material also formed a barrier between the substrate surface and the atmosphere. According to the present invention, solder may be flow deposited to a selected portion of a solder-wettable substrate without the need for the intimate contact heretofore required between a solder stop-off and the substrate to be coated with the solder. Another equally important objective of the present invention allows a substrate to be provided with a flowably deposited layer of solder material adhered to selected surfaces of the terminal, with the solder layer desirably terminating at an imaginary barrier line. The imaginary barrier line is created by a purposely formed capillary, with a flux coated surface of the substrate forming one surface of the capillary and a non-wettable solder resisting material forming another opposed surface of the capillary, the presence of the solder resistant material stopping the flow of molten solder over the substrate surface at the imaginary barrier line adjacent to the capillary.

The invention further relates to a method of mounting an electrical terminal in a plated aperture of a board type substrate upon removal of flux residue from the terminal, and upon inserting the terminal together with its adhered layer of solder within the metallized aperture. The solder is then reflowed and the solder is drawn by a wicking action into the clearance between the substrate aperture and the inserted terminals. Sufficient solder is provided to form solder fillets surrounding the terminal at each open end of the substrate aperture.

In addition, the invention relates to a method of modifying the solder striped contacts, produced according to the method described above, whereby their insertion or mounting in the plated apertures of the above-described board type substrate is facilitated. More particularly the solder deposited on the individual contacts according to the above-described method generally forms a band surrounding each contact when it hardens. This solder band is generally of a diameter which is somewhat larger than the diameter of the plated apertures in the board type substrate material. The solder band therefore interfits frictionally with the interiors of the plated apertures, and requires the use of a substantial amount of pressure in forcing the solder striped contacts into the apertures. It is noted that the pressure may be applied either by pressing contacts into the apertures from the top, or preferably, pulling them through the apertures by applying a drawing force to the extended lower portions thereof. Although it is desirable that a friction fit should result upon insertion of the striped contacts into the apertures, it is not desirable that an extremely high pressure or force be required to mount the contacts in the apertures, since large forces may deform or stretch the contacts, or may cause the solder bands to fracture or break partially away from the contacts, thereby reducing the remaining amount of solder adhered to the contacts to a level below that which is required to hold the contacts securely in place upon being reflowed. Accordingly, the present invention includes a technique for applying pressure to both sides of the solder bands adhered to each of the contacts, resulting in two effects. First, the flattened solder bands are smaller in diameter at their flattened portions than the plated apertures, thereby reducing the friction, and correspondingly the force required to insert the solder striped contacts into the plated apertures. Second, in the process of flattening, hairline fractures are created in portions of the solder band, causing these portions to shear away with relative ease as the band comes in contact with the edge portions of the plated apertures. Accordingly, the flattened solder bands reduce the amount of force required to mount the solder striped contacts in the board type substrates, but do not prevent the formation of desirable friction or interference fits, nor do they interfere in any manner with the remaining operational aspects of the solder striped contacts.

It is therefore an object of the present invention to provide an article of manufacture fabricated from a solder wettable material and provide thereon with a flowably deposited layer of solder adhered to selected portions of the article and with the margins of the solder terminating at desired imaginary barrier lines.

Another object of the present invention is to provide a solder stop-off for limiting the spreading of a flowable solder over a solder wettable surface, including a solder non-wettable material adjacent to the solder wettable surface and forming a capillary, with the presence of the nonwettable material repelling the solder and preventing flow of the solder into the capillary.

Yet another object of the present invention is to provide a solder stop-off for limiting the spreading of a flowable solder over a solder wettable surface by the presence of a nonwettable material adjacent to the wettable surface and preventing flow of the solder along the wettable surface adjacent to the surface of the solder nonwettable material.

It is another object of the present invention to provide a solder resistant capillary for limiting the flow of molten solder, with the capillary formed between a solder wettable surface and another solder nonwettable surface.

Still another object of the present invention is to provide a method of mounting an electrical terminal in a plated aperture of a board type substrate wherein the terminal together with a flowably applied layer of solder adhered to selected portions of the terminal is inserted into the substrate and the solder thereof is reflowed, to fill the clearance between the substrate aperture and the inserted terminal, and to form solder fillets surrounding the terminal.

It is yet another object of the present invention to provide a selectively pre-soldered electrical terminal, the terminal including a flow deposited layer of solder adhered to a selected portion of the terminal with solder spreading limited by the presence of a solder nonwettable surface adjacent to but not necessarily touching the electrical terminal.

Still another object of the present invention is to provide an article of manufacture fabricated from a solder wettable material and provided thereover with an adhered layer of flowably deposited solder over the article without the need for a solder resistant material coating the article or a barrier between the article and the atmosphere.

Another object of the present invention is to provide method and apparatus for flow depositing adhered layers of solder in controlled band widths to respective solder wettable articles of manufacture serially in an automated operation without the need for a solder resistant coating on the articles or a barrier between the articles and the atmosphere.

Yet another object of the present invention is the provision of a novel method for treating solder striped contacts prior to their insert into a board type substrate.

A still further object of the present invention is the provision of a novel contact structure having a flattened solder band adhered thereto.

Another object of the present invention is the provision of a unique method for flattening solder bands adhered to contact structures.

Briefly, these and other objects of the invention are achieved by providing an electrical terminal with a localized quantity of solder applied by flow deposition techniques. The solder is limited from spreading over the surface of the electrical terminal by the presence of a solder-non-wettable material positioned adjacent to, but not touching the electrical terminal. This application technique provides a solder stop-off without a need for a solder resistant coating or an atmospheric barrier which is adherent to the electrical terminal and which must subsequently be physically removed. The terminals thus treated have bands of solder adhered to them, and are adapted to be inserted into plated-through apertures in a board or substrate material. The solder bands are then reflowed, and the resulting molten solder is drawn by a wicking action into the apertures in the substrate to firmly hold the electrical terminals in place. A method and apparatus are also disclosed for flattening the solder bands to facilitate the insertion of the terminals into the plated-through apertures. Pressure is applied to the solder bands, causing them to be flattened and causing a plurality of hairline fractures to be created within the flattened bands. The flattened bands reduce the insertion resistance by reducing the area of interference between the flattened bands and the edges of the apertures. In addition, the hairline fractures substantially weaken the structural integrity of the solder bands, permitting the solder to be readily folded back or scraped away from the terminals as the terminals are forcibly inserted into appropriate apertures whose diameters are smaller than the widths of the flattened solder bands.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is an enlarged detail section taken along the line 2 of FIG. 1;

FIG. 3 is an enlarged detail section taken along the line 3—3 of FIG. 1;

FIG. 4 is a plan view of the portion of the preferred embodiment shown in FIG. 1 with portions in section to illustrate the details thereof;

FIG. 5 is a preferred embodiment of an article of manufacture according to the present invention in the form of an electrical terminal;

FIG. 6 is a plan view of the preferred embodiment shown in FIG. 5;

FIG. 7 is an enlarged plan view of another preferred embodiment of the present invention in the form of an electrical terminal;

FIG. 8 is an enlarged detail section taken along the line 8—8 of FIG. 7;

FIG. 9 is an enlarged detail section taken along the line 9—9 of FIG. 5;

FIG. 13 is a schematic perspective illustration of a preferred embodiment of the present invention showing the apparatus for flow depositing solder, as shown in FIG. 1, and further illustrating an apparatus for flattening solder bands;

FIG. 14 is an enlarged cross-sectional view of the apparatus for flattening solder bands illustrated in FIG. 1;

DESCRIPTION OF THE PREFERRED EMBODIMENTS

Figure 1:
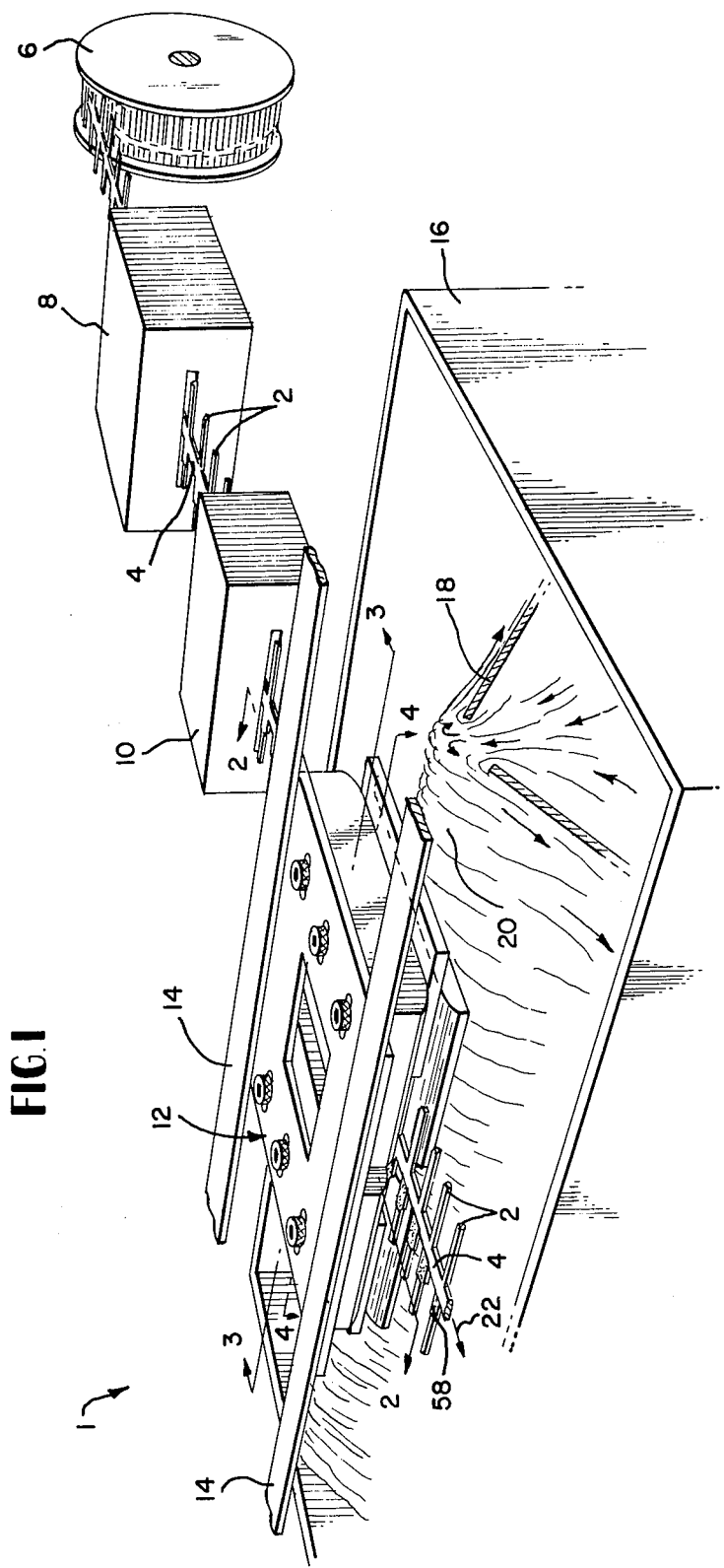
FIG. 1 is a schematic perspective of a preferred embodiment of the present invention illustrating apparatus for flow depositing solder onto selected portions of solder wettable substrates in an automated operation.

Referring now to the drawings, wherein like reference numerals designate identical or corresponding parts throughout the several views, and more particularly to FIG. 1 thereof, there is shown an apparatus generally indicated at 1 for controllably applying flow deposited layers of solder onto respective articles of manufacture in the form of electrical terminals. The terminals are generally indicated at 2 and are serially spaced along an integral carrier strip 4. Initially, the carrier together with the terminals are supplied from a storage reel 6. The carrier 2 is conveyed longitudinally through a flux coating station conveniently in the form of a flux bath. The terminals 2 are serially entirely coated with a layer of flux of any desired type in preparation for the application of solder in a manner to be described in detail. Although the entire surface of each terminal 2 is coated with flux, it is understood that the flux can be applied only to selected portions of the terminal which are to receive the solder adheredly thereto.

The carrier 4 together with the flux coated terminals 2 are then serially conveyed to a flux drying station 10 wherein the flux is solidified or otherwise rigidized by the application of heat, for example. The carrier and terminals are then serially conveyed through a fixture 12 mounted on rails 14. The rails 14 suitably position the fixture 12 over a conventional wave soldering apparatus 16. More particularly, the rails position the fixture 12 over the conventional wave soldering weir 18, the fixture 12 being partially immersed within the wave 20 of molten solder formed by the weir 18. As the terminals 2 are passed through the fixture 12 they become immersed partially in the wave 20 and receive an adhered layer of flowably deposited solder on selected portions thereof. The fixture 12 limits spreading of the molten solder over the surfaces of the terminals 2 and thereby provides a solder stop-off limiting the solder spreading without a need for a protective coating on the terminals or a barrier between the terminals and the atmosphere surrounding the terminals. Thus, as will be explained in detail hereinafter, the fixture 12 acts as a solder stop-off which is adjacent to, but not necessarily touching the surfaces of the terminals 2. Whereas protective coatings or atmospheric barriers heretofore utilized in the prior art provide positive structural barriers for limiting solder spreading, the fixture 12, since it does not necessarily touch the surfaces of the terminals 2, provides an imaginary barrier line beyond which spreading of the molten solder is prevented.

Thus the fixture together with the conventional wave soldering machine provides a solder applying station wherein molten solder is applied to selected portions of a solder wettable material. Since it has been found that the fixture 12 which forms a mask for limiting spreading of the solder need not necessarily touch the solder wettable terminals, the terminals are readily passed through the solder fixture together with the conveyed carrier allowing solder to be applied in an automatic process. The fixture is partially immersed in the solder wave 20 to permit selective application of the solder in a circumferential stripe or band of controlled width over each of the terminals 2. Although the soldering is accomplished in an automated operation as shown in FIG. 1, it is to be understood that the solder stop-off technique utilizing the fixture 12 is well suited for solder application by dipping in molten solder or another equivalent hand operation.

As further shown in FIG. 1, the terminals 2 together with the integral carrier strip 4 are conveyed from the fixture 12 in the direction of the arrow 22 to a flux removal station (not shown) and a storage take-up reel (not shown). As shown in FIG. 1, taken together with the remaining Figures, each terminal is provided thereover with a circumferential stripe or band of solder adhered to the surfaces of the terminal. The width of the solder band is precisely controlled by the solder stop-off provided by the fixture 12.

As shown in FIGS. 2, 3 and 4, the fixture 12 includes a suspension plate 24 connected by suitable fasteners 26 to each of the rails 14. The fixture 12 further includes a first pair of solder resistant plates 28 and 28' secured in abutting relationship with respect to the plate 24 by a plurality of suitable fasteners 30. The plates 28 and 28' include an inverted planar surface 32 and 32' contiguous with arcuate inverted chambers 34 and 34' on each side of the surfaces 32 and 32'. Another pair of plates 36 and 36' are provided with planar surfaces 38 and 38' in opposed adjacent relationship with respect to the surfaces 32 and 32'. The surfaces 38 and 38' are contiguous with arcuate chambers 40 and 40' in opposed relationship with respective chambers 34 and 34'. A shim 42 is interposed between the plates 28 and 36. A similar shim 42' is interposed between the plates 28' and 36'. The opposed surfaces 32 and 38 as well as the surfaces 32' and 38' define therebetween, aligned elongated passageways through which the carrier 4 together with the serially mounted terminals 2 are conveyed in the direction of the arrow 44. Each of the plates 28, 28', 36 and 36' as well as each of the shims 42 and 42' may be fabricated from a solder resistant material, which may advantageously be of a metal such as chromium or an organic material such as polytetrafluroethylene. Each of the fasteners 30 is provided with a threaded head 46 for suitably clamping the plates and the shims in cooperating relationship as shown particularly in FIG. 3. In the clamped relationship, the plates 28 and 28' have opposed spaces surfaces 48 and 48' defining therebetween a weir. A remaining portion of the weir is defined between inverted arcuate chambered surfaces 50 and 50' provided on each of the opposed surfaces of the plates 36 and 36'.

As shown in FIG. 4, portions of the terminals 2 and the carrier strip 4 are removed for clarity to indicate the opposed parallel surfaces 50 and 52' provided on the shims 42 and 42', respectively. The surfaces 50 and 52' define a throat area, which guide the terminals 2 as they are conveyed through the fixture 12, and properly locate selected portions of the terminals over the weir portions 48 and 48' and 50 and 50'. Each of the shims 42 and 42' are provided with elongated slots 54 and 54' respectively receiving corresponding fasteners 30. The slots 54, 54' provided in the shims thus provide an adjustment of the throat area defined between the edges 52 and 52', as well as an adjustment for locating selected portions of each terminal 2 over the weir portion defined between the arcuate surfaces 50 and 50'. In similar fashion, the plate 24 is provided with elongated slots 56 receiving the shank of corresponding fasteners 30. The slots provide for slidable adjustment of the plates 28 and 36 with respect to the corresponding plates 28' and 36' to controllably vary the width of the weir.

In operation, the fixture 12 is partially immersed into the solder wave 20 with the plates 36 and 36' obstructing the wave and raising a portion 56 thereof into the weir. More particularly, the curved surfaces 50 and 50' channel a sufficient mass of molten solder to form the raised wave portion 56, which is restricted in width to that of the weir formed between the plates. Accordingly, the solder wave 20 is disturbed by the presence of the fixture 12 to form a restricted raised wave portion 56 which impinges upon and covers a medial portion of the terminals 2 which are conveyed through the fixture guides provided by the surfaces 50 and 52' of the shims 40 and 42', respectively. Although some clearance is provided between the fixture 12 and the conveyed terminals 2 which allows passage of the terminals through the fixture, molten solder is prevented from spreading over the surfaces of the terminals and adheres only to those terminal portions which traverse through the weir. Accordingly, the presence of the solder nonwettable material which is adjacent to but not necessarily touching the solder wettable surfaces of each flux coated terminal 2 provides a solder stop and an imaginary barrier to solder flow without the need for a positive structural barrier in the form of a barrier coating adhered directly to the terminal surfaces. An enlarged plan of an exemplary electrical terminal 2 is shown in FIG. 7. As each terminal emerges from the fixture it is provided with a solidified band 58 of solder, the width of which band is precisely controlled by the presence of the solder nonwettable material which forms the weir of the fixture 12. As shown in FIG. 8, the rectangular cross section of the terminal 2 is illustrated. Each of the planar surfaces of the electrical terminal 2 is provided thereover with its own layer of solder. Accordingly, layers 60 and 64 of generally convex arcuate cross section are respectively adhered to opposed planar surfaces of the terminal 2, and additional layers 62 and 66 of convex arcuate cross section are adhered to the remaining opposed sides of the terminal 2. Together the layers 60, 62, 64 and 66 form a generally elliptical band of solder encircling and adhered to the terminal 2.

Figure 10:
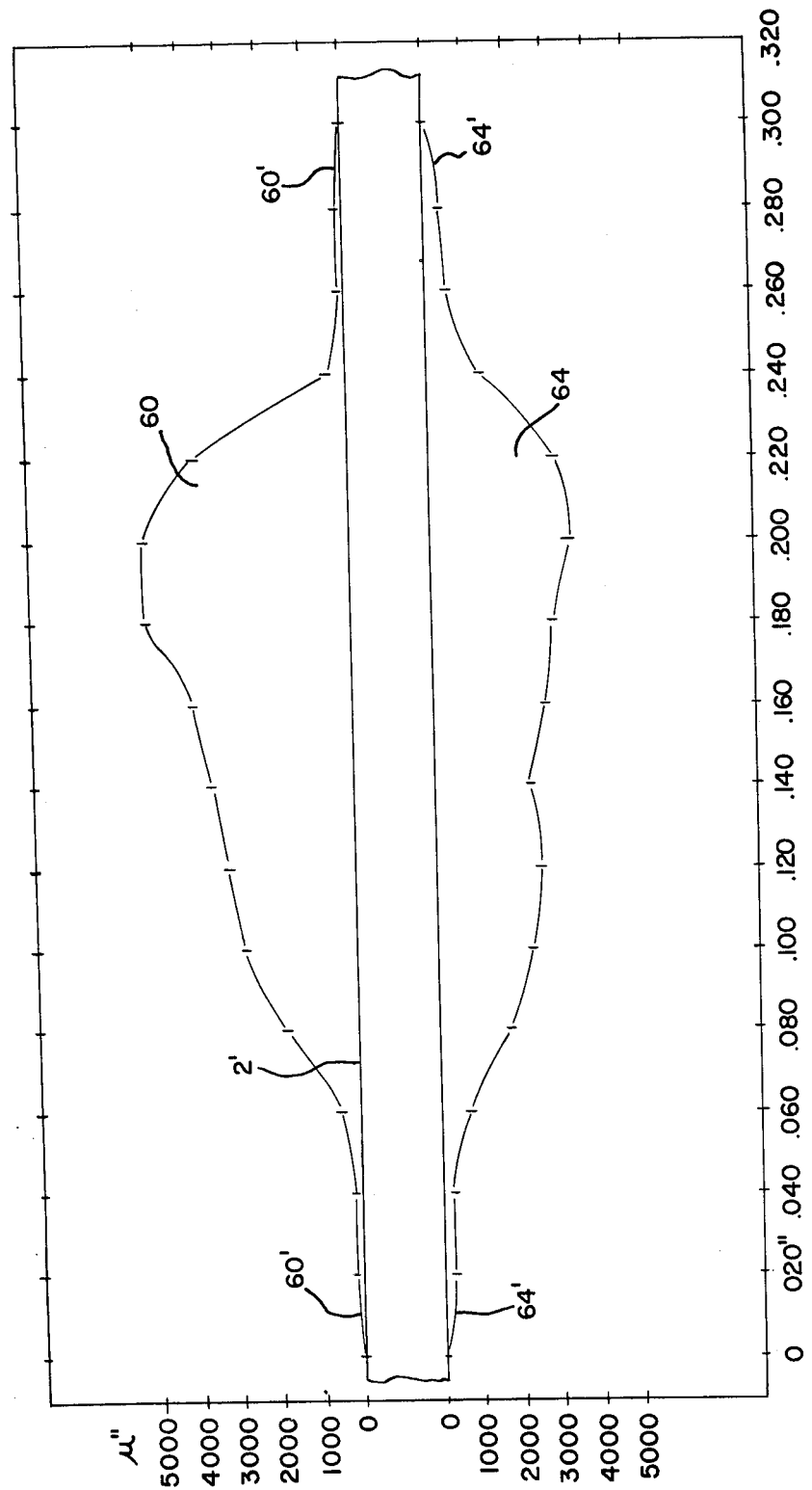
FIG. 10 is a diagrammatic view of a section taken along the line 10—10 of FIG. 7.

FIG. 10 is a diagrammatic representation of a cross section of the terminal 2 and the solder layers 60 and 64 thereon. As shown in the diagram, the layer 60 has a maximum width of approximately 5,000 microns, and the layer 64 has a maximum thickness of about 3,500 microns. The end portions 60' of the layer 60 which determine the band width of the layer appear to form a relatively small acute angle, rather than an oblique angle, with respect to the surface 2' of the terminal 2. This angle is known as the dihedral angle indicative of the degree of wetting between the solder and the solder wettable substrate. Since the solder is applied in a molten state, the surface tension thereof should create a relatively smooth obverse curvature in each of the layers 60 and 64. However, upon observation such surfaces appear irregular in curvature. This can be explained partially by the disturbances in the surfaces of the layers 60 and 64 as the terminals are conveyed through the fixture 12. More specifically, as the terminals emerge from the raised solder wave portion 56, the excess solder mass is caused to run off, thereby disturbing the surface of the molten solder adhered to the terminals. In addition, solidification of the adhered solder occurs at an uneven rate further causing irregularities in the solder layers.

The following examples are indicative of typical results and preferred embodiments obtained according to the present invention.

EXAMPLE I

Gold plated post-type electrical terminals stamped and formed from 0.022 thick stock were spaced on a carrier strip on 0.125 centers. The terminals were conveyed from a storage reel at a speed of about feet per second through a molten resin flux bath. The terminals were entirely coated with the flux which was subsequently dried. The flux coated terminals were then conveyed through the soldering fixture 12 fabricated from a solder resistant material, namely polytetrafluoroethylene. The shims 42 and 42' were 0.030 inches thick to allow ready passage through the fixture of the 0.022 inch thick stock. The fixture was partially immersed within a solder wave of a commercially available wave soldering machine. Military specification solder, namely 60–40 tin-lead solder at 480° F was selectively applied to form adhered bands of solder of controlled band widths on the terminals. The terminals were further conveyed to a solvent bath which removed all traces of remaining rosin flux. The terminals provided thereon with bands of solder were then wound upon a storage take-up reel.

EXAMPLE II

Gold plated post-type terminals 0.022 inch thick and spaced on 0.125 centers on a carrier strip were hand dipped in a rosin flux bath and then dried to leave a flux coating over the terminals. A plurality of flux coated terminals were then placed in the fixture which was hand dipped into a molten solder bath of 60–40 tin-lead solder at 480° F. Upon examination it was found that a dipping operation sufficiently applied the desired layers of molten solder to discrete bands in accordance with the present invention.

In order to test the solder fixture effectiveness for different stock thicknesses and spacing, or to test for different stock or solder materials several test terminals may be placed in the fixture and hand dipped into the molten solder. Upon removal from the fixture the terminals may be inspected to determine whether the test conditions are satisfactory to permit the fixture limiting the solder spreading as desired.

As a result of such testing, and several hand dipping operations, the following observations were made. The thickness of the adhered solder layer varies inversely with the exposure time of the terminals to the heat of the solder bath or solder wave. Accordingly, a longer dwell or exposure time of the terminals results in a correspondingly thinner solder layer. The spreading characteristics of the flux utilized were not relied upon to insure solder spreading, since the agitation as a result of the solder wave or hand dipping operation was sufficient to spread the solder over the surfaces desired to be coated. However, the presence of the flux is required in all cases to insure solder wetting of the surfaces to be coated. Accordingly, the present invention is directed to the use of solder resistant material adjacent to but not necessarily touching the surface of a solder wettable surface desired to be coated with solder. The presence of the solder resistant material limits the flow of the solder, thus providing a solder stop-off without the need for resistant coating or barrier layer adhered to the solder wettable surface. Although not wishing to be bound by any theory of operation, it is believed that the presence of the solder nonwettable material adjacent to the solder wettable surface provides a capillary which ordinarily would induce spreading of the molten solder entirely over the wettable surface. However, since one surface of the capillary is formed by the nonwettable material, such material repels the solder and enhances its tendency to agglomerate and puddle under the action of its surface tension. Accordingly, it is apparent that the forces resulting from the solder surface tension and the repelling nature of the nonwettable material overcomes the wicking action afforded by the capillary as well as the spreading ability of the flux present on the solder wettable surfaces. Solder spreading is further limited somewhat by the presence of entrapped gases between the shims 42 and 42'. However, such presence of gases is sufficiently difficult to control and thereby cannot be relied upon to effectively limit solder spreading with precision. Accordingly, trapped gases appear to contribute little to the operation of the preferred embodiments of the invention as described. It is apparent that solder cannot be effectively limited from spreading if the solder is super heated or is forcibly injected into the capillaries formed by the clearance between the fixture and the terminals 2. In addition, the fixture material must be chosen to resist warping or other structural variations at the relatively high solder temperature, which would destroy the dimensions of the formed capillaries. In addition, the surfaces of the fixture often deteriorate after prolonged exposure to the solder material. Impurities in the solder material often causes plating of the solder to the otherwise resistant fixture surfaces. In addition, the terminal spacing serially from one another could be sufficiently close to create a capillary therebetween and further impair effectiveness of the solder resistant material to limit solder spreading.

With reference to FIG. 5, another exemplary terminal 68 will be described in detail. A plurality of similar terminals may be serially mounted on a carrier strip 70, and provided thereover with bands of solder, one of which is shown at 72, flowably applied to the terminal surfaces in a manner described above. As shown in FIG. 9 the terminal 68 is square in cross section with the planar surfaces of the terminal provided thereover with convex solder layers 74, 76 and 78 and 80 adhered respectively thereto. As shown in FIG. 5, the solder band 72 may have arcuate extended margins 82 which are formed on the surface of the terminal 68 which first engages the solder wave as the terminal is conveyed through the wave. It was found that the margins 82 occur because the conveyed terminal displaces masses of melted solder laterally within the passageway formed between the fixture plates. However, on all the other terminal surfaces, the solder band is positively confined into a predetermined band width, as described. As shown, the terminal 68 is provided with a generally hooked end portion 84. Accordingly, the fixture must be formed with a passageway conforming to the hooked end portion of the terminal to allow passage of the terminal therethrough and prevent the solder from contacting the terminal portion 84.

Figure 11:
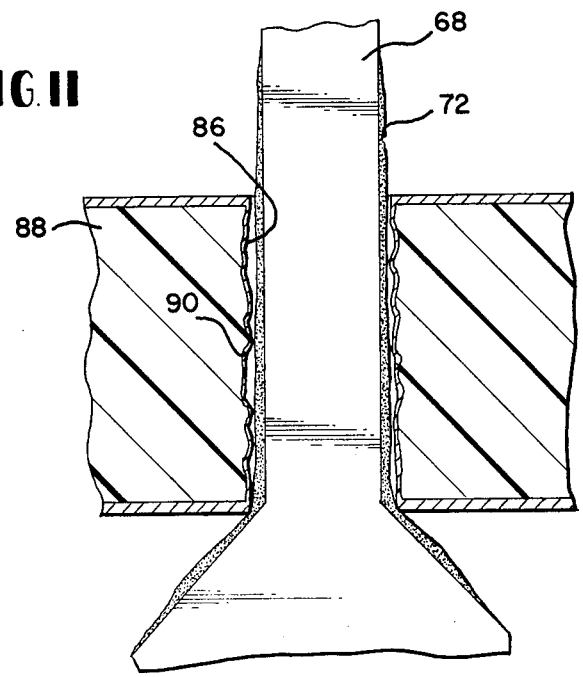
FIG. 11 is an enlarged section of a portion of the preferred embodiment shown in FIGS. 5 and 6 inserted within a metallized aperture of a board type substrate.
Figure 12:
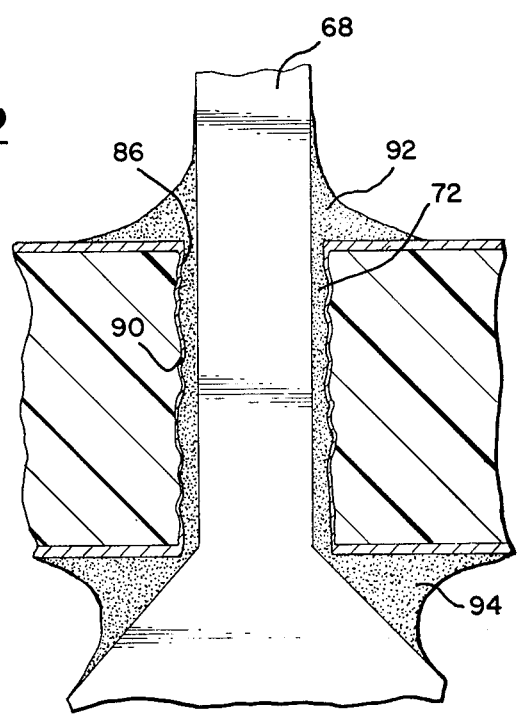
FIG. 12 shows the preferred embodiment as shown in FIG. 11 with the solder reflowed to fill the clearance between the metallized aperture and the inserted terminal and to form fillets encircling the terminal.

As shown in FIGS. 11 and 12, the terminal 68 is inserted within an aperture 86 of a board type substrate 88. The board as well as the aperture 66 is coated with a metallized layer 90. As shown in FIG. 11, the solder band 72 is located within the metallized apertures 86. As shown in FIG. 11, the inserted band 72 of solder extends entirely along the longitudinal dimension of the metallized aperture 86 and is of a dimension so as to extend entirely through the thickness of the substrate 88.

FIG. 12 illustrates the solder band 72 being reflowed by any suitable solder reflowing technique to entirely fill the clearance between the metallized aperture 86 and the inserted terminal 68. In addition, sufficient solder mass is provided so that upon reflowing thereof fillets 92 and 94 are formed at each open end of the metallized aperture 86 and in surrounding adhered relationship to the terminal 68. Since all flux residue is removed from the terminal, in accordance with the operation as described in FIG. 1, solder is prevented from flowing off the terminal. In addition, a wicking action is provided by the clearance between the aperture and inserted terminal to insure proper solder flow and formation of the fillets.

Further aspects of the present invention are illustrated in FIGS. 13 through 16. More particularly, FIG. 13 illustrates in schematic form an apparatus that may be used to flatten the solder bands adhered to the terminals 2. Flattening of the solder bands greatly facilitates mounting of the terminals in board type substrates of the type described above, as will become more clear presently.

As shown in FIG. 13, the terminals 2 attached to the carrier strip 4 emerge from the wave soldering machine 16 with solder bands adhered to them. Instead of being directly wound on a take-up reel, as in the above-described embodiment, the banded terminals pass through a band flattening machine 100 positioned between the wave soldering machine 16 and the take-up reel (not shown). The flux removal station not shown but heretofore described may be located between the flattening machine 100 and the take-up reel, or between the soldering machine 6 and the flattening machine 100 as desired. The band flattening machine is shown in schematic form as including a motor 110 which drives a cam 112. The cam drives a reciprocating ram 114 which is slidably mounted in a cylindrical bearing 116 mounted in the top portion of a housing 118. In the illustrated embodiment, the ram 114 is preferably biased by a spring (not shown) toward the surface of the cam 112 so that the ram undergoes a reciprocating motion following the rotation of the cam 112. The motor 10 in this embodiment may be a conventional electric motor. It will, of course, be understood that the illustrated motor and cam assembly is only intended to constitute a representative embodiment, and the present invention is by no means limited to the specific mechanism illustrated. Many different types of devices can be used in place of the illustrated device, such as a vise press, various types of reciprocating hydraulic presses, as well as numerous equivalent devices for applying the pressure needed to flatten the solder bands. In general, this pressure was found by experiment to be a requisite of approximately forty pounds per contact to flatten the solder bands adequately. Thus, where a large number of bands are to be flattened simultaneously, the force required to be delivered by the band flattening machine is forty times the number of contacts to be flattened by each cycle of the machine.

Referring now to FIG. 14, the interior of the exemplary band flattening machine 100 is illustrated greatly magnified. In particular, the ram 114 is shown as including a shank 120 having a face plate 122 securely fastened thereto. A flattened solder band 124 adhered to one of the terminals 2 is shown positioned between the face plate 122 and a butt plate 126. The flattened solder band 124 is initially a solder band of the type illustrated at 72 in FIGS. 5 and 6, for example, and also illustrated in a cross-section in FIGS. 8 and 9, and in longitudinal section in FIG. 10. As shown in these figures, the solder band initially formed on each of the terminals 2 is of a generally oval cross-sectional configuration. Similarly, the thickness of the solder band varies substantially along the length of each terminal. For instance, in the example illustrated in FIG. 10, the thickness of the solder band varies from 0 to approximately 5,000 microns. Naturally, the thickness of the solder band also varies somewhat among the individual terminals passed through the wave soldering machine. This variation in the thickness of the solder band can cause difficulty in inserting the terminals through the plated apertures in the board type substrate material. The diameters of the apertures are relatively consistent, and are preferably somewhat smaller than the overall diameter of the solder band to permit a firm metal to metal contact between the solder bands and the plating lining the apertures, whereby reflowing of the solder bands will adhere the solder to the plating in the apertures. However, while a tight fit is desirable, the fit is required for a temporary interval, and therefore need not be so snug or rigid to serve as a means for connecting and mounting the terminals permanently in the apertures. In fact, caution must be exercised to prevent the fit from being so tight that an extraordinary amount of force is required to insert the solder banded terminals in the plated apertures, since excessive force can result in stretching or bending of the terminals, warping of the board type substrate, stripping the plating material out of the apertures or shearing the solder band away from the terminal so that insufficient solder remains to be properly reflowed in the final terminal assembly process. It is only required that the fit be sufficiently tight to provide metal to metal contact of the solder and the plating lining the apertures.

Consequently, it has been found desirable to create a fit which positively holds the individual terminals in place, but yet does not require an excessive amount of retention force to permanently mount terminals within the plated through apertures. This type of fit can be guaranteed by the process of flattening the solder bands, for reasons which will presently become more clear. In considering the nature of the fit, two principal factors were first considered. First, to form the fit, it is not necessary that the solder band firmly engage the interior of each plated aperture around its entire circumference. Instead, it is only necessary that the solder bands engage the interior portions of the plated apertures at least one and preferably two or more circumferential areas. Thus, while it is clear that the encircling solder band structure illustrated in FIG. 8, for example, would not engage a round aperture over the entire internal circumferential area of the aperture, the relatively large arcuately convex solder layers 62 and 66 would engage a relatively large angular percentage of the interior of each aperture. Engagement of even this percentage of the interior area of each plated aperture is in excess of that required to provide an adequately firm interference fit.

In this regard it should be pointed out that, in the ideal case, the solder layers adhering to the upper and lower surfaces of the terminal 2, that is, the solder layers 60 and 64 shown in FIG. 8, are substantially symmetrical, and are thin enough so that they do not substantially exceed the diameters of an aperture into which the solder banded terminal is to be inserted. However, as shown in FIG. 10, these solder layers are generally not symmetrical in practice, and are often much thicker than is desirable. Thus, they often are of excess sizes so as to engage the inner surfaces of the plated apertures, and create a situation in which a force much greater than that which is desirable is required to appropriately forcibly insert the terminals in the apertures. Controlling the thickness of these portions of the solder band in the coating process is extremely difficult, as will be apparent from the foregoing discussion, and from an understanding of the coating process. Accordingly, it is highly desirable to modify the dimensions of these portions of the solder band, by flattening for example, subsequent to the coating process in the wave soldering machine, rather than to attempt to precisely regulate the solder coating process to the extent that each solder band has precisely correct dimensions in all cases.

Furthermore, when the solder hardens on each terminal, it forms a relatively dense mass the surface of which is not easily sheared or scraped away as the terminals are inserted into appropriate apertures. Thus, the structural rigidity of the solder band, as initially formed, is greater than required. Both of these factors are taken into consideration in the solder band flattening technique described herein. In particular, referring again to FIG. 14, the solder band 124 is shown in the process of being flattened. In the flattening process, the hardened solder band does not behave in the manner of a completely elastic or malleable substance. Instead, it is a tin-lead substance which is not work hardenable and which behaves as a partially malleable and a partially non-malleable substance. In other words, the solder band is partially deformed elastically and partially crushed and fractured in the process of flattening. As a result, upper and lower flat surfaces 128 and 130 are formed at opposite sides of the flattened solder band 124, while some of the displaced solder is formed into upper and lower flanges 132 and 134, respectively, which contain numerous hairline fractures.

Figure 15:
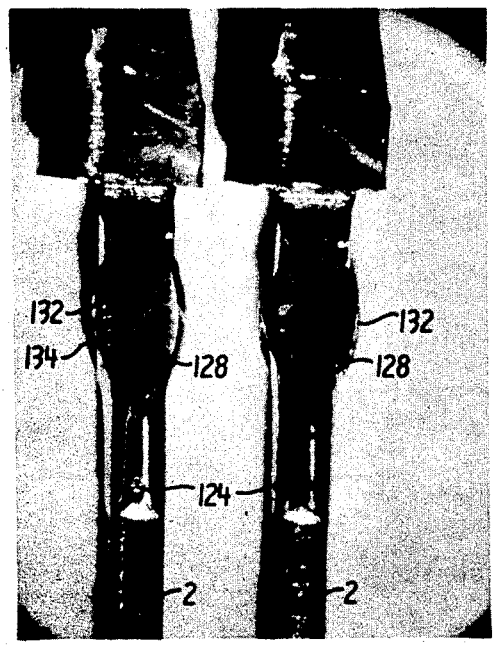
FIG. 15 is a photomicrograph of a pair of actual electrical terminals having flattened solder bands thereon, magnified 15 times actual size.

The actual appearance of these features is shown in FIG. 15 which is a photomicrograph showing a pair of actual flattened solder bands magnified fifteen times. In FIG. 15, the general outwardly bulging shape of the flanges 132 may be clearly seen. The extent of this outward bulge is, of course, related to the thickness of the solder band at the point of flattening.

Figure 16:
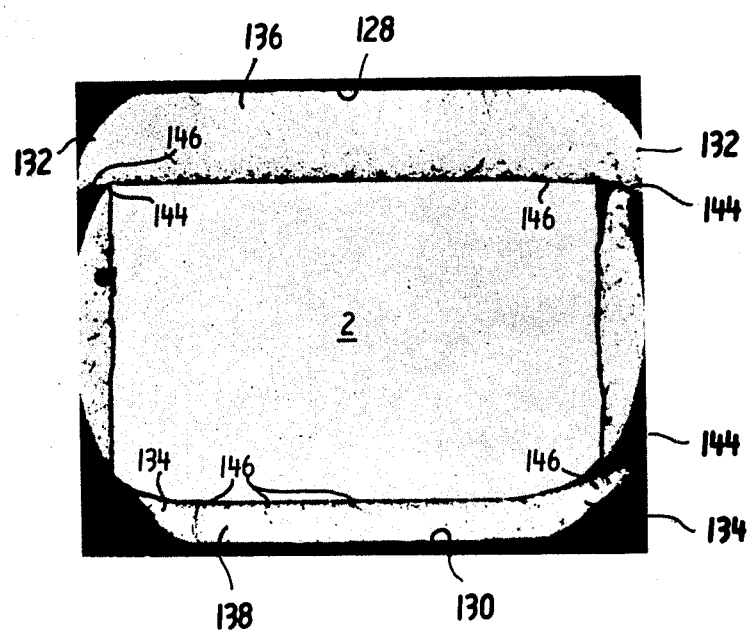
FIG. 16 is a photomicrograph of a cross-sectional view of an electrical terminal carrying a flattened solder band illustrating the hairline fractures created in the solder, magnified 100 times actual size; and, FIG. 17 is an enlarged sectional view of a portion of an electrical terminal having a flattened solder band adhered thereto upon insertion into a plated aperture similar to those illustrated in FIGS. 11 and 12.

The structural effects of the flattening operation are illustrated even more clearly in FIG. 16 which is a photomicrograph of a flattened solder band magnified 100 times. FIG. 16 is thus similar to the more idealized cross-sectional illustration set forth in FIG. 8, wherein the solder adhered to the terminal 2 is shown in a generally oval pattern prior to flattening. FIG. 16 illustrates that in practice, the solder distribution may not be perfectly symmetrical, as illustrated in FIG. 8. Although the lack of symmetry is not crucial in the context of the present invention, it should be pointed out that it is generally necessary that at least some of the solder adheres to all four sides of the terminal 2. However this necessity poses no problem whatever in the coating operation and is easily attained thereby.

In FIG. 16, the solder layers 136 and 138 adhering to the upper and lower planar surfaces of the terminal 2 are equivalent to flattened versions of the solder layers 60 and 64 of FIG. 8. Similarly, the arcuately convex solder layers 140 and 142 adhering to the right and left planar surfaces of the terminal 2 are generally equivalent to the solder layers 62 and 66, respectively, illustrated in FIG. 8. As is shown in FIG. 16, the flattening process forms flattened surfaces 128 and 130 on the solder layers 136 and 138, respectively, as previously described. The flattening process also results in the development of a fracture line 144 at the junction between the upper and lower solder layers 136 and 138, and the right and left solder layers 140 and 142. It will be noted that no fracture line is formed at the lower left hand corner of the terminal 2 in the actual example illustrated in FIG. 16 as a result of the fact that the solder distribution was not symmetrical, but was relatively thin in the area of the lower left-hand corner. However, this factor does not affect the operation of the present invention, as long as a sufficient amount of solder is adhered to each terminal to create fracture lines at three corners of each banded terminal. Each fracture line 144 defines a position at which one of the flanges 132 or 134 overhangs the solder layers 140 and 142 adhered to the side portions of the terminal 2. These overhanging portions have been found to be laced with hairline fractures 146 throughout their length. Some of these hairline fractures do not, of course, clearly show in FIG. 16, since FIG. 16 illustrates only a 100X magnification of but a single cross-sectional plane of the terminal and solder band. Other hairline fractures 146 are formed in peripheral portions of the solder band, where the effect of the flattening process is most pronounced. The hairline fractures greatly weaken the structural strength and rigidity of the solder band, so that peripheral portions of the solder band are more easily sheared away as each of the banded terminals is forced into an appropriate aperture. Furthermore, the flattened surfaces 128 and 130 of the solder bands are deformed to the extent that they do not engage the interior surfaces of the apertures into which the various terminals are inserted. Thus, possible contact between the solder banded terminals and the apertures in which they are placed is confined to the right and left solder layers 140 and 142, and to the protruding flanges 132 and 134. However, as pointed out above, the flanges 132 and 134 are riddled with hairline fractures, and therefore tend to shear away rather easily as the solder banded terminals are inserted into appropriate apertures. Thus, while the flanges 132 and 134 engage the inner surfaces of the various apertures, providing the desired metal to metal contact, they have a reduced structural strength, due to the hairline fractures and due also to their substantial reduction in size, and therefore are easily deformed as the terminals are inserted into appropriate apertures without the need for applying a large amount of force. Accordingly, engagement between the banded terminals and the apertures in which they are positioned is substantially confined, according to the present embodiment of the invention, to the side solder layers 140 and 142 and to the flange portions 132 and 134.

FIG. 17 illustrates the insertion of a terminal having a flattened solder band 124 adhered to it into an aperture 86 in a board type substrate 88. The board and aperture are coated with a metallized layer 90, in the same manner as illustrated in FIGS. 11 and 12. In FIG. 17, the flattened solder band 124 is illustrated as having a width which is greater than the diameter of the plated aperture 86. The portion of the flattened solder band 124 which extends beyond the diameter of the aperture 86 may, for example, be the flange portions 132 and 134 illustrated in FIG. 16. However, as pointed out above, these flange portions are reduced in size and are also riddled with hairline fractures, and accordingly have a low structural strength. Thus, upon forcing the terminal into the aperture, the protruding flange portions of reduced structural strength are easily separated or sheared away from the main body of the flattened solder band. The separated portions may partially break away from the solder band 124 and be discarded by brushing, blowing or rinsing away the separated particles of solder. However, these discarded portions of the solder band do not constitute a significant percentage of the total amount of solder, and thus do not adversely reduce the remaining mass of solder required to form a solder joint for mounting of the terminal. Other portions of these weakened segments may remain partially attached to the solder band, forming solder ears 148 extending outwardly across the surface of the board 88. However, it is not necessary to remote purposely the solder ears 148 or to in any way treat terminals carrying a flattened solder band 124 any differently from terminals carrying the non-flattened solder bands. This is true because upon reflowing of the solder band, in the manner previously described, the wicking or capillary action previously described and associated with the aperture 86 draws all of the molten solder into the aperture, including that portion of the molten solder formed by melting of the attached ear portions 148. Accordingly, the ear portions disappear upon reflowing of the solder, and the resulting distribution of solder is precisely the same as for the previously described terminals carrying non-flattened solder bands. Accordingly, after the solder is reflowed, it assumes substantially the same shape and configuration as illustrated in FIG. 12.

It will be noted that in FIG. 17 the terminal is shown only partially inserted into the aperture 86. This illustrates the difference in width between the flattened solder band and the diameter of the aperture 86. However before reflowing the solder, the terminal illustrated in FIG. 17 is fully inserted into the aperture 86 in substantially the same manner as the terminal illustrated in FIG. 11.

It will be seen from the foregong disclosure that the flattening of each solder band reduces the force required to insert each of the solder banded terminals into appropriate apertures in the board type substrate by first, reducing the total area of contact between the solder band and the interior surface of each aperture, and second, structurally weakening the portions of the solder band which engage the interior surfaces of the apparatus. As a result, a suitable interference fit is formed between the solder banded terminals and the aperture without need for the application of excessive force in mounting the solder banded terminals.

The solder banded terminals are preferably mounted using the pull-through fixture shown in U.S. Pat. No. 3,800,416, and assigned to the same assignee as the present application. Although the pull-through fixture in the referenced application is shown in use with a multiple layer board, it will be apparent to those skilled in the art that it can also be used with a single layer board. Naturally, other types of mounting techniques and apparatuses may also be used with the terminals disclosed herein.

Although preferred embodiments and modifications of the present invention have been described and shown in detail, other modifications and embodiments of the present invention are intended to be covered in the spirit and scope of the appended claims, wherein:

What is claimed is:

1. A method for selectively depositing solder on a selected portion of a conductor, comprising the steps of: fabricating a fixture of solder resistant material, providing an elongated opening in said fixture, passing a conductor lengthwise along said opening of said fixture, exposing a selected portion of said conductor from said fixture, applying molten solder in contact with said exposed selected portion of said conductor while passing said conductor along said opening of said fixture, repelling molten solder from the remaining unexposed portions of said conductor by the solder resistant material of said fixture and thereby preventing touching between remaining unexposed portions of said conductor and said molten solder, solidifying and adhering said molten solder to said exposed selected portion of said conductor, and removing said conductor from said fixture together with said solidified and adhered solder on said selected portion of said conductor.

2. The method as recited in claim 1, and further including the step of: applying solder flux material on at least said exposed selected portion of said conductor prior to the step of applying molten solder to said exposed selected portion of said conductor.

3. A method of treating electrical contacts prior to insertion through plated openings in a board type substrate comprising the steps of:
 forming solder bands on said electrical contacts; and
 subjecting each of said solder bands to a prescribed pressure whereby the shape of each of said bands is modified, said step of subjecting includes the steps of:
 elastically deforming a first portion of the solder in each of said solder bands; and,
 forming numerous fractures in a second portion of each of said solder bands, whereby the structural integrity of said second portion of each of said solder bands is substantially reduced.

4. A method of treating electrical contacts prior to insertion through plated openings in a board type substrate comprising the steps of:
 forming solder bands on said electrical contacts; and
 subjecting each of said solder bands to a prescribed pressure whereby the shape of each of said bands is modified, said step of subjecting includes the step of:
 creating a plurality of hairline fractures in at least a portion of each of said solder bands whereby the structural integrity of said portion is substantially reduced.

* * * * *